US009999161B2

(12) United States Patent
Mease et al.

(10) Patent No.: US 9,999,161 B2
(45) Date of Patent: Jun. 12, 2018

(54) REVERSIBLE FAN ASSEMBLY

(71) Applicant: Intel Corporation, Santa Clara, CA (US)

(72) Inventors: Keith Mease, Gibbstown, NJ (US); William F Federer, West Chester, PA (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 14/570,297

(22) Filed: Dec. 15, 2014

(65) Prior Publication Data

US 2016/0174409 A1    Jun. 16, 2016

(51) Int. Cl.
*H05K 7/20* (2006.01)

(52) U.S. Cl.
CPC ..... *H05K 7/20727* (2013.01); *H05K 7/20172* (2013.01)

(58) Field of Classification Search
None
See application file for complete search history.

(56) References Cited

U.S. PATENT DOCUMENTS

| | | | | | |
|---|---|---|---|---|---|
| 5,050,667 | A * | 9/1991 | Berner | ..................... | F24F 7/065 165/137 |
| 6,351,380 | B1 * | 2/2002 | Curlee | ..................... | F16B 5/065 165/80.3 |
| 6,373,698 | B1 * | 4/2002 | Christensen | .............. | G06F 1/20 174/16.1 |
| 6,504,716 | B2 * | 1/2003 | Huang | ............... | H05K 7/20172 361/695 |
| 6,999,313 | B2 * | 2/2006 | Shih | ................... | H05K 7/20172 165/104.33 |
| 7,054,155 | B1 * | 5/2006 | Mease | ................ | H05K 7/20581 165/104.34 |
| 7,154,748 | B2 * | 12/2006 | Yamada | ............. | H05K 7/20572 361/690 |
| 7,408,774 | B1 * | 8/2008 | Anderl | ............... | H05K 7/20727 174/16.1 |
| 7,466,545 | B2 * | 12/2008 | Hung | ...................... | G06F 1/181 361/679.48 |
| 7,492,592 | B2 * | 2/2009 | Ye | ......................... | F04D 29/582 174/16.1 |
| 8,295,041 | B2 * | 10/2012 | Cheng | ....................... | G06F 1/20 165/80.3 |
| 8,320,120 | B1 * | 11/2012 | Chan | .................. | H05K 7/20727 165/121 |
| 8,425,286 | B2 * | 4/2013 | Coster | ..................... | G06F 1/181 361/695 |
| 8,570,741 | B2 * | 10/2013 | Liu | .......................... | G06F 1/20 165/121 |
| 9,066,444 | B2 * | 6/2015 | Adrian | ............... | H05K 7/20172 |
| 9,169,845 | B2 * | 10/2015 | Takeuchi | ............ | F04D 25/0613 |
| 2007/0041157 | A1 * | 2/2007 | Wang | ...................... | G06F 1/203 361/679.54 |

(Continued)

*Primary Examiner* — Courtney Smith
(74) *Attorney, Agent, or Firm* — Schwegman Lundberg & Woessner, P.A.

(57) ABSTRACT

An electronic device includes a chassis having a recess and a fan assembly captured by the recess, wherein the fan assembly is moveable out of the recess to rotate such that airflow through the fan assembly moves in different directions to cool the electronic device as a function of such rotation.

15 Claims, 8 Drawing Sheets

(56) References Cited

U.S. PATENT DOCUMENTS

| | | | | |
|---|---|---|---|---|
| 2007/0047200 A1* | 3/2007 | Huang | ...................... | G06F 1/20 |
| | | | | 361/695 |
| 2007/0076368 A1* | 4/2007 | Pike | ......................... | G06F 1/20 |
| | | | | 361/679.48 |
| 2007/0133168 A1* | 6/2007 | Shabany | ............ | H05K 7/20581 |
| | | | | 361/695 |
| 2008/0013275 A1* | 1/2008 | Beckley | ................ | H05K 7/186 |
| | | | | 361/695 |
| 2009/0154092 A1* | 6/2009 | Chen | ...................... | G06F 1/187 |
| | | | | 361/679.51 |
| 2009/0310302 A1* | 12/2009 | Hu | .................... | H05K 7/20172 |
| | | | | 361/695 |
| 2011/0122573 A1* | 5/2011 | Peng | ......................... | G06F 1/20 |
| | | | | 361/679.48 |
| 2014/0211419 A1* | 7/2014 | Liao | .................. | H05K 7/20727 |
| | | | | 361/695 |

\* cited by examiner

REVERSIBLE FAN ASSEMBLY

TECHNICAL FIELD

Embodiments described herein pertain to a reversible fan assembly.

BACKGROUND

Rack mounted fabric and networking switch products may be mounted in a rack cabinet in both front facing and rear facing orientations. Some products are offered with the option to optimize cooling for either orientation as an ordered preconfigured model. Other products need to be partially disassembled to reverse the flow based on the orientation. Still other products electrically reverse the flow via switches; however, reversing the flow is not feasible for high performance fans due at least to directional flow fan blade optimization.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

Easy and safe end user access to reconfigure fan airflow direction in an electronic device is provided by removing a limited access cover. The fan airflow may be reconfigured in one embodiment by rotating a mechanically captured fan assembly.

Access to the chassis is controlled via the limited access cover by reducing the possibility of personal injury and product damage to or from unskilled personnel. Embodiments, control motion of the fan assembly and reduce or eliminate the need to disconnect electrical connection to the fan assembly. A switch feature may be integrated to detect the fan flow direction for electronic reporting to a management system and may also include a visual indication of flow direction.

There are some fans that are electrically reversible but not in the high performance version utilized for many electronic devices. High performance fans may have blades that are aerodynamically optimized for operation in one direction.

Figure 1:
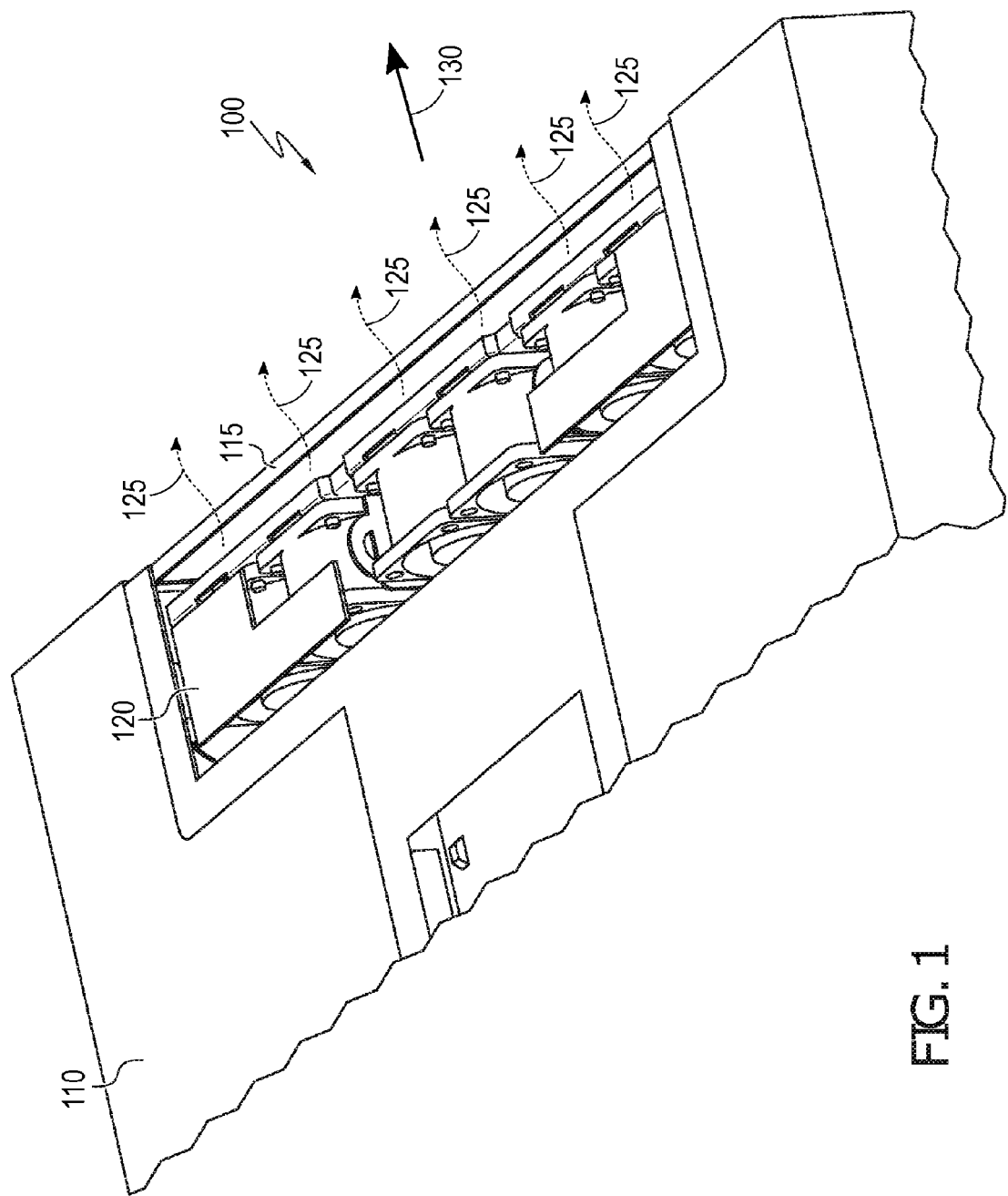
FIG. 1 is a block perspective diagram of an electronic device and an exposed reversible fan assembly in a first position according to an example embodiment.
Figure 4:
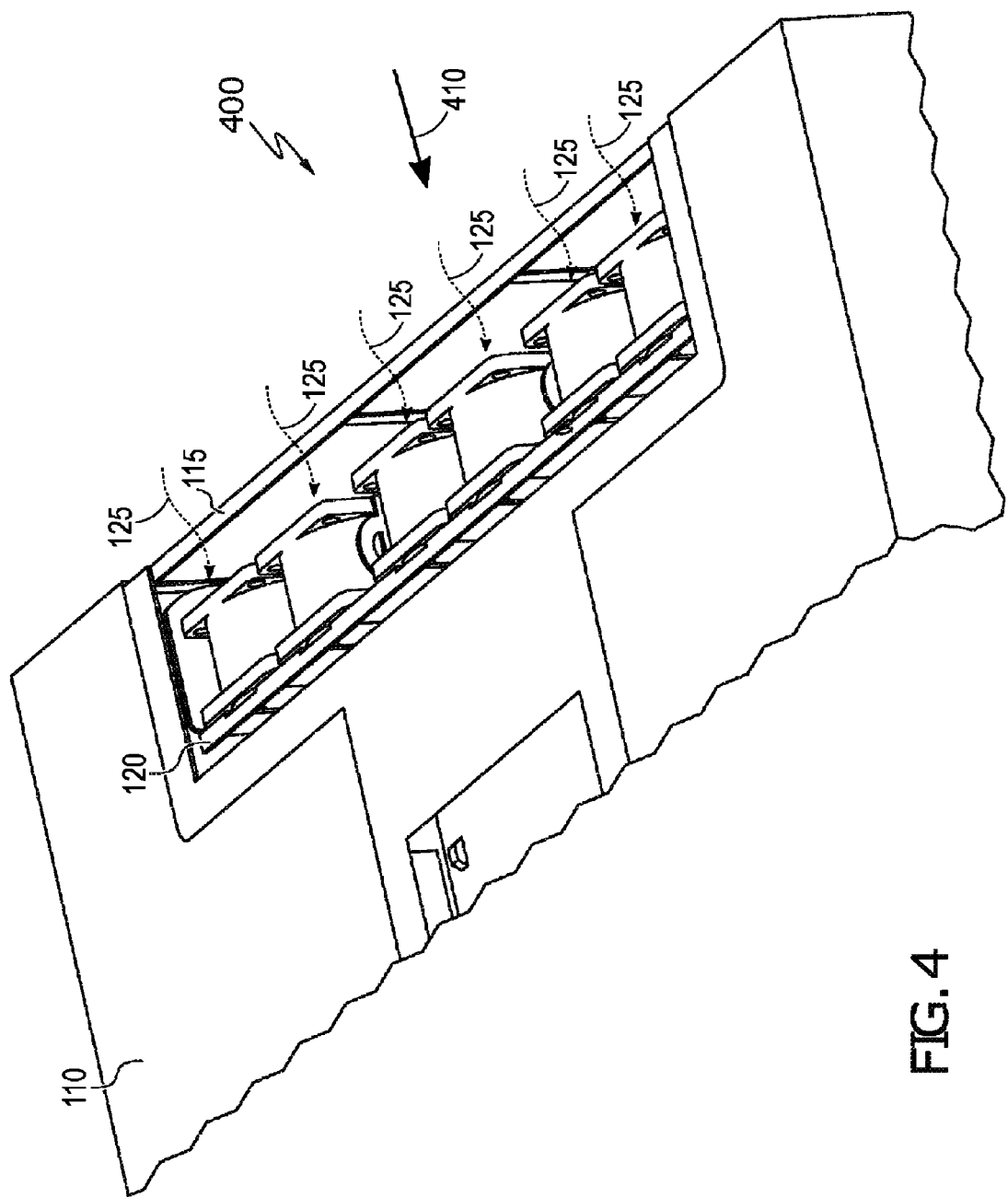
FIG. 4 is a block perspective diagram of an electronic device and an exposed reversible fan assembly in a reversed position according to an example embodiment.

FIG. 1 is a block diagram illustration of an electronic device 100 having a chassis 110 that covers electronics and protects them from direct user access and from the environment in which the device 100 is operating. One such environment is in a rack of equipment in which the device may be mounted. The device 100 may be mounted in the rack such that the airflow 125 to cool the electronics may be in either of two directions, either exiting from a side 115 of the chassis 110, (e.g., a first direction 130), or entering from the side 115 of the chassis 110 (e.g., a second direction 410, as shown in FIG. 4 and described further herein).

To assist with the airflow 125, a fan assembly 120 is disposed within the chassis 110. The fan assembly 120 in one embodiment is disposed near the side 115 of the chassis 110 to provide a clear path for airflow through the fan and to not interfere with the layout of electronics in the chassis 110. The fan assembly 120 may be oriented in different portions of the chassis 110 in further embodiments. FIG. 1 illustrates the electronic device 100 with a limited access panel removed. The limited access panel may provide a user with access to the fan assembly 120 while the chassis 110 still serves to protect other components, such as the electronics of the device 100 from user access. Thus, the limited access panel limits access to only the fan in one embodiment. The limited access panel may by screwed to the chassis 110 and easily removable with a screwdriver, or may be snap fit into place and removed and replaced without the use of tools.

Figure 2:
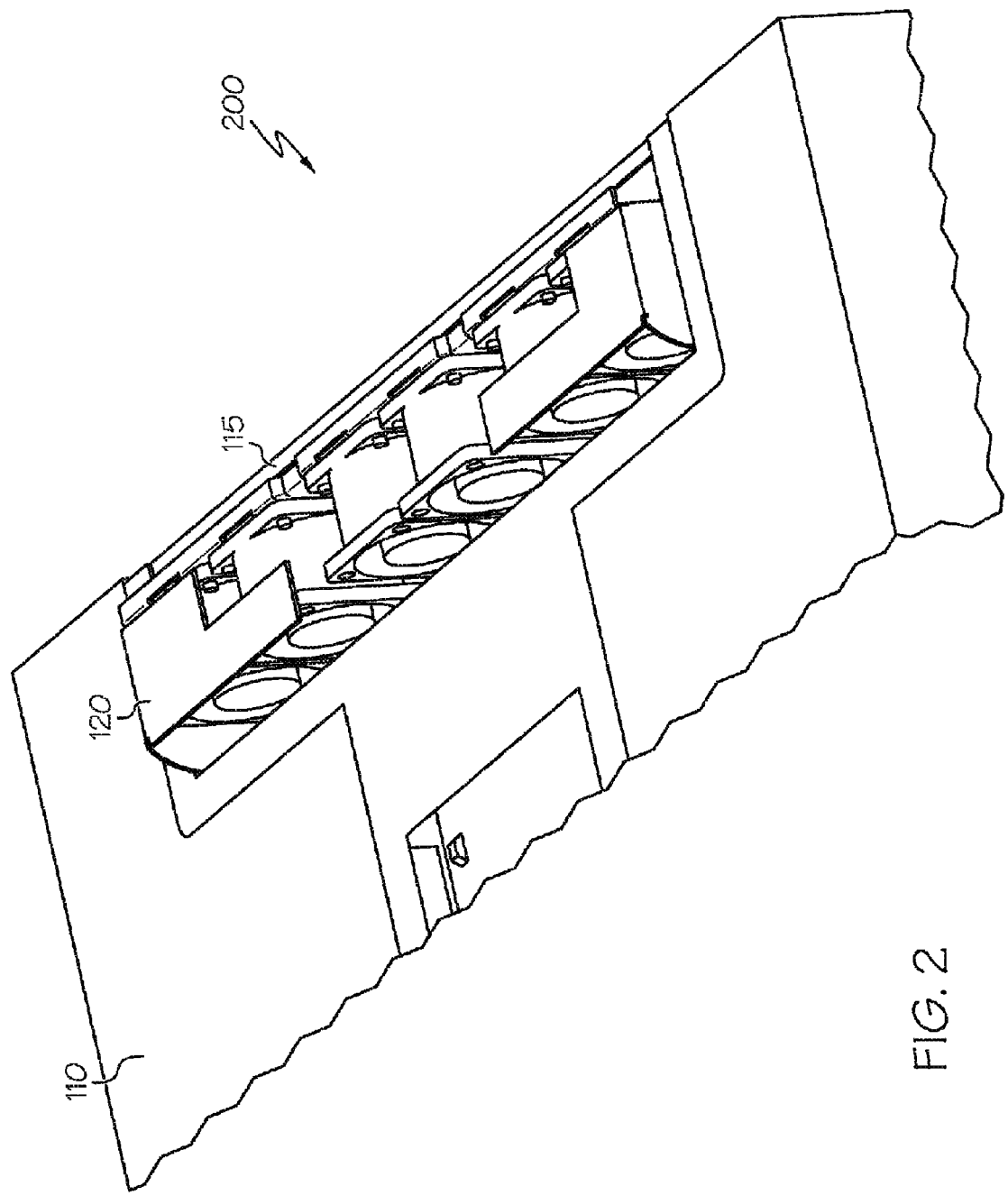
FIG. 2 is a block perspective diagram of an electronic device and an exposed reversible fan assembly partially lifted from a recess according to an example embodiment.
Figure 3:
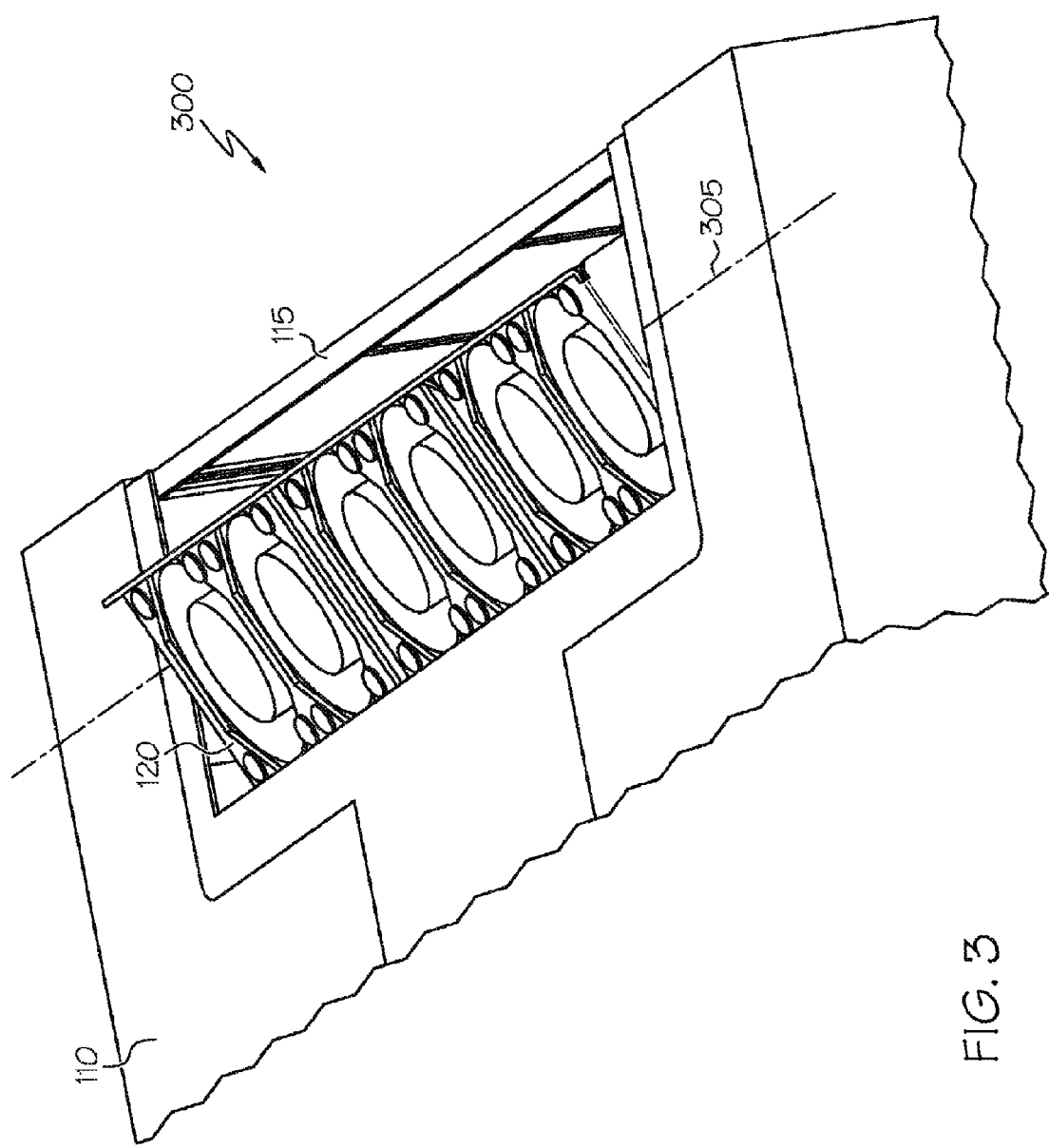
FIG. 3 is a block perspective diagram of an electronic device and an exposed reversible fan assembly partially rotated toward a reversed position according to an example embodiment.

In FIG. 1, fan assembly 120 is shown in a first position that blows air out of side 115. FIGS. 2, 3, and 4 illustrate rotation of the fan assembly 120 to blow air over the electronics from side 115. The direction of the airflow 125 is thus totally reversed between FIG. 1 (e.g., the first direction 130) and FIG. 4. (e.g., the second direction 410). FIG. 2 illustrates the fan assembly 120 being lifted partially out of a recess in the chassis 110. FIG. 3 illustrates the fan assembly 120 being rotated along a longitudinal axis 305 along which up to six or more individual fans 310, 315, 320, 325, 330, and 335 are wired together and disposed in the fan assembly 120. A different number of fans may be used in further embodiments, such as between 1 and 10 or more fans.

Figure 5:
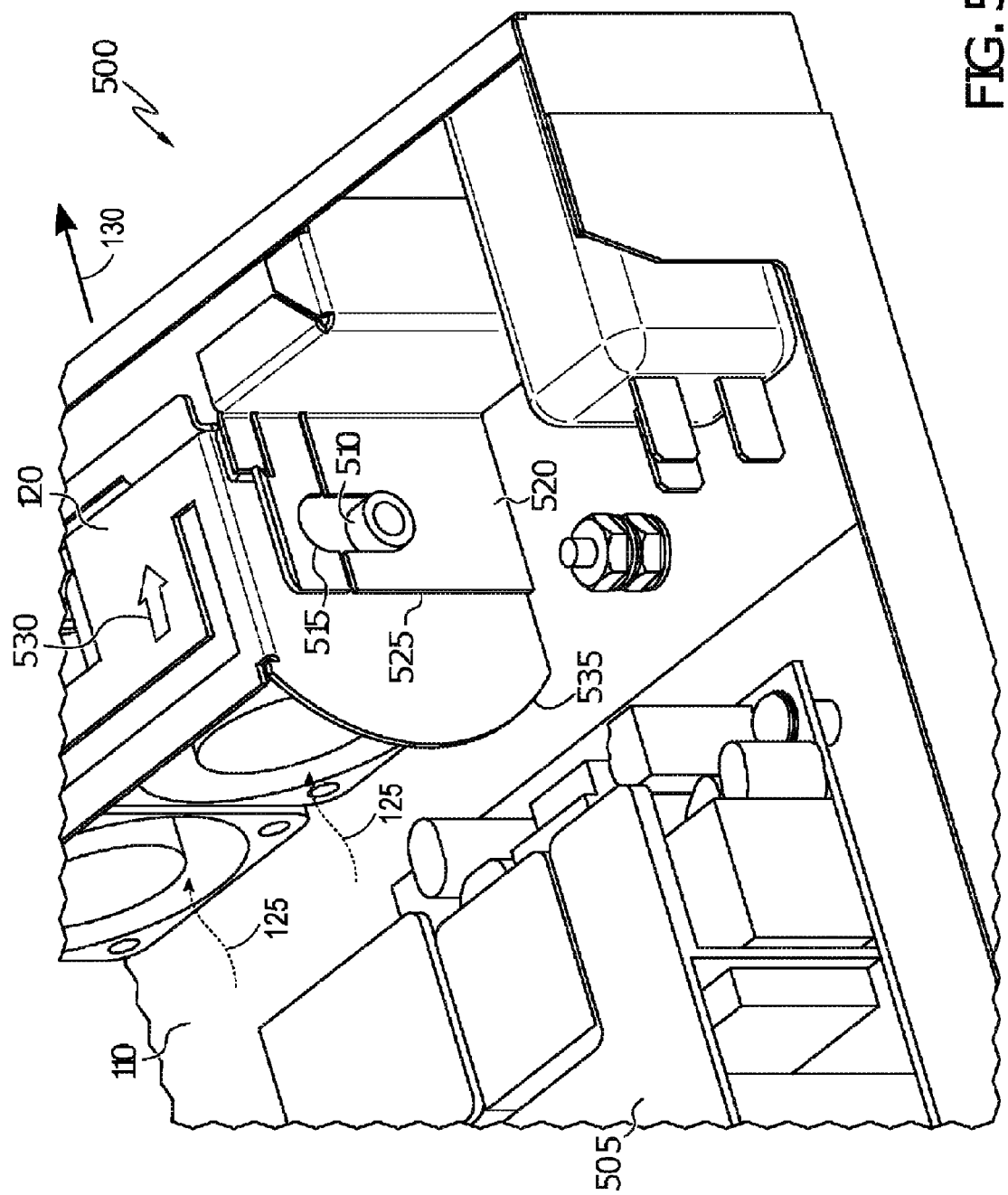
FIG. 5 is a block perspective diagram of an electronic device and an exposed reversible fan assembly illustrating rotating structures according to an example embodiment.

FIG. 5 is a partial block diagram view of the inside of the chassis 110 generally at 500. Fan assembly 120 is partially illustrated with two fans viewable, as well as electronic circuitry or components 505, which may not be accessible by only removing the limited access panel, but is shown here with further protective covering removed. The fan assembly 120 is retained using cylindrical pins, one pin 510 is illustrated and captured in a slot 515 to provide the retention and allow rotation. The slot 515 is formed on a plate 520 that rises up in the chassis 110. A second slot is formed in a plate on the other end of the fan assembly 120, which is not shown. Together, the plates form a recess 525 in the chassis 110 that is sized to retain the fan assembly 120. The fan assembly 120 may be snap fit into the slot during assembly, and is not meant to be removed by a user, but may be removed by trained service personnel.

To change the direction of airflow 125, for instance, between the first direction 130 and the second direction 410, the fan assembly 120 is lifted and rotated to reversing the direction of the airflow 125. The pin 510 and slot 515 operate to allow the fan assembly 120 to be lifted an amount corresponding to the length of the slot 515. The fan assembly 120 may be lifted partially out of the recess 525, allowing it to be rotated without removing the fan assembly 120 completely from the recess 525. The slots 515 allow the pins 510 to slide up as the fan assembly 120 is lifted, while retaining the fan assembly 120 within the chassis 110. The recess 525 may be sized to fit the fan assembly 120 in either of two positions to blow air toward the outside of the chassis 110 (e.g., in the first direction 130) as indicated by an arrow 530 embossed, printed, or otherwise formed such that is may be viewed by a user, or to draw air into the chassis 110. An arced guide feature 535 may be disposed on a lateral side of the fan assembly 120 to facilitate rotation and provide a visual indication of a rotation direction to the user.

In one embodiment, a gasket 540 may be positioned on the fan assembly 120. The gasket 540 may be formed of a compressible material and positioned to fit between the limited access cover and a top side of the fan assembly 120. The gasket may function to hold the fan assembly 120 in the recess 535 when the cover is installed on the chassis 110. Note that in further embodiments, both top and bottom sides of the fan assembly 120 include a gasket such that one of the gaskets contacts the cover when installed regardless of fan assembly 120 orientation. In some embodiments, the fan assembly 120 is sized such that the cover may only be installed when the fan assembly 120 is properly seated in the recess in one of two permitted orientations. In still further embodiments, the gasket may be positioned on the cover, serving the same function, with or without a gasket on the fan assembly 120.

Figure 6:
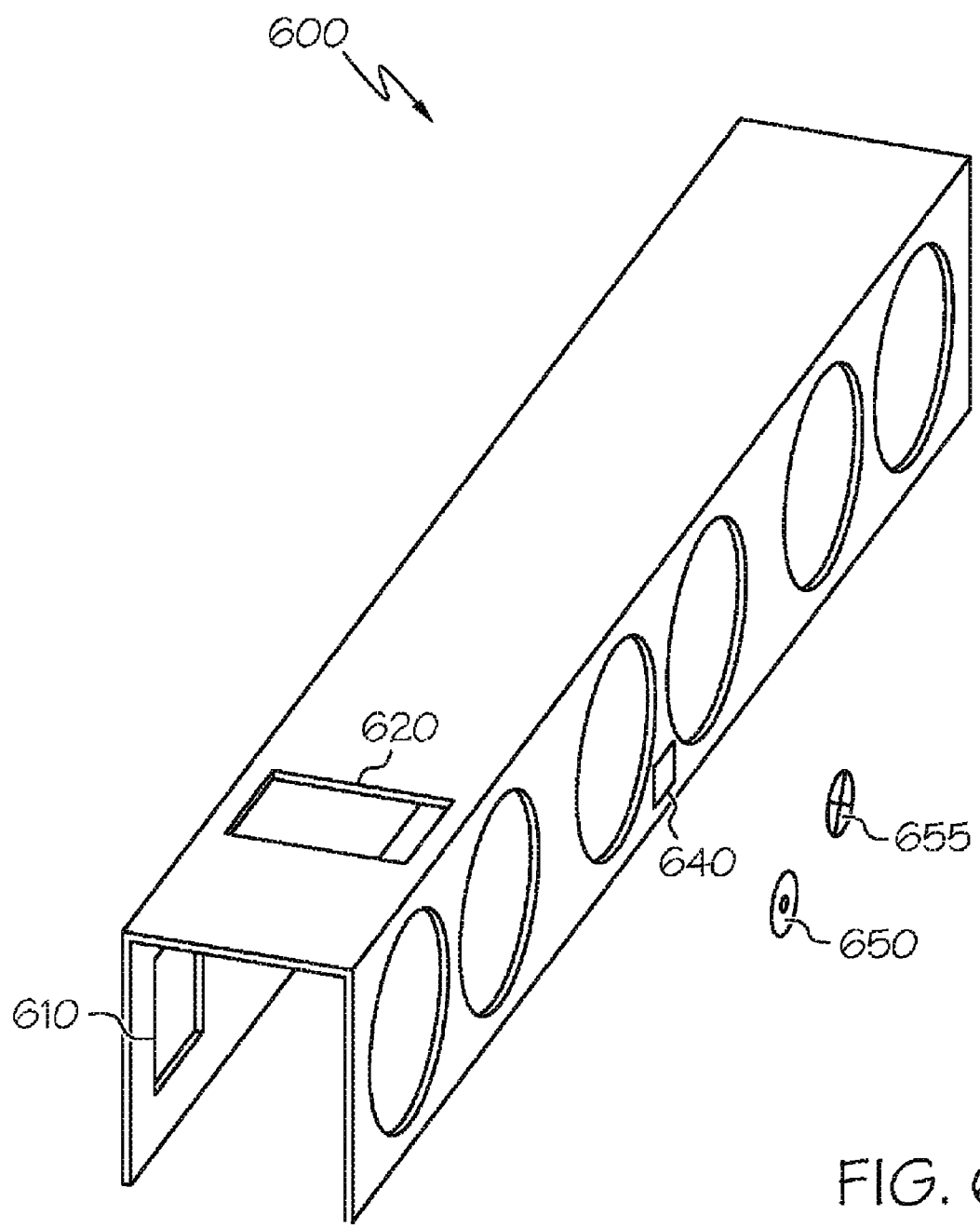
FIG. 6 is a block perspective diagram of a limited access cover of an electronic device to provide access to a reversible fan assembly in a first position according to an example embodiment.

FIG. 6 is a block diagram view of a limited access cover 600 that contains a feature 610 that require removal of the AC power cords, effectively removing power from high voltage components that may be part of electronic circuitry 505 and the fan assembly. The cover 600 may be a fairly flat panel in one embodiment, or may one two or more sides as illustrated. Cover 600 basically serves to provide fairly easy user access to the fan assembly 120 to allow rotation of the fan assembly, 120. It may also serve to not provide access to other components 505 of the electronic device which might prove harmful to the device or user without proper training.

The feature 610 may be a cut-out that allows a power cord connector to couple to power distribution circuitry within the chassis 110, yet is shaped to require removal of the cord connector when the cover 600 is removed from the chassis 110 to allow access to the fan assembly. In further embodiments, feature 610 may be located on different parts of the cover 600, such as a front side or back side depending on where power is provided to the electronic device. Note that feature 610 is optional, and is intended as an additional safety measure.

In one embodiment, the limited access cover 600 also includes a cut-out 620 positioned to allow visual access to indicator 530 when the cover is installed. Cut-out 620 may include a transparent cover to allow visual access to indi-
cator 530. In a further embodiment, a further cut-out 640 is provided on a side of the cover 600 covering side 115 of the chassis 110. The further cut-out 640 provides access to a symbol indicative of the direction of the airflow 125, such as the first direction 130 or the second direction 410, that is positioned on the fan assembly. Typical international symbols for airflow 125 towards or into at 650 and away from or out of at 655 fan assembly 120 are illustrated. At least one of each symbol may be positioned on opposite sides of the fan assembly 120 such that they are visible through one or more cut-outs or openings of the cover 600.

Figure 7:
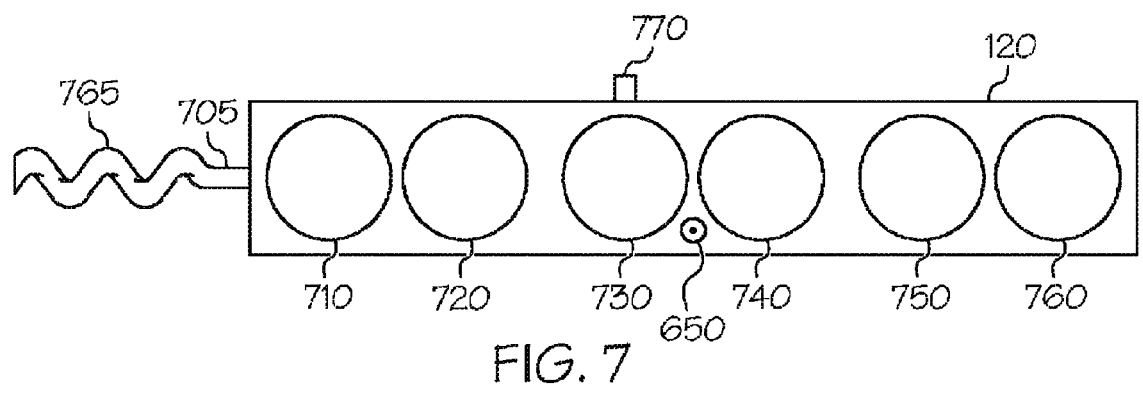
FIG. 7 is a side block elevation view of a reversible fan assembly according to an example embodiment.

FIG. 7 is a side elevation block diagram view of a fan assembly 120 separated from the chassis 110. Visual indicator 650 indicative of airflow 125 into the fan assembly 120 is shown embossed, printed or otherwise formed in a user viewable manifestation. In one embodiment, the visual indicator 650 may be readily visible with and without the limited access panel installed, such as through side 115, or through a cutout in the limited access panel. One such symbol may be provided on each side such that only one symbol type appears, clearly identifying the direction of the airflow 125 of the fan when installed. A wiring harness 705 is electrically coupled to fans 710, 720, 730, 740, 750, and 760 to provide for managing the wire connections, such as by including slack in the harness indicated at 765 to permit rotation of the fan assembly 120 into either position without disconnecting the wiring harness 705.

Figure 8:
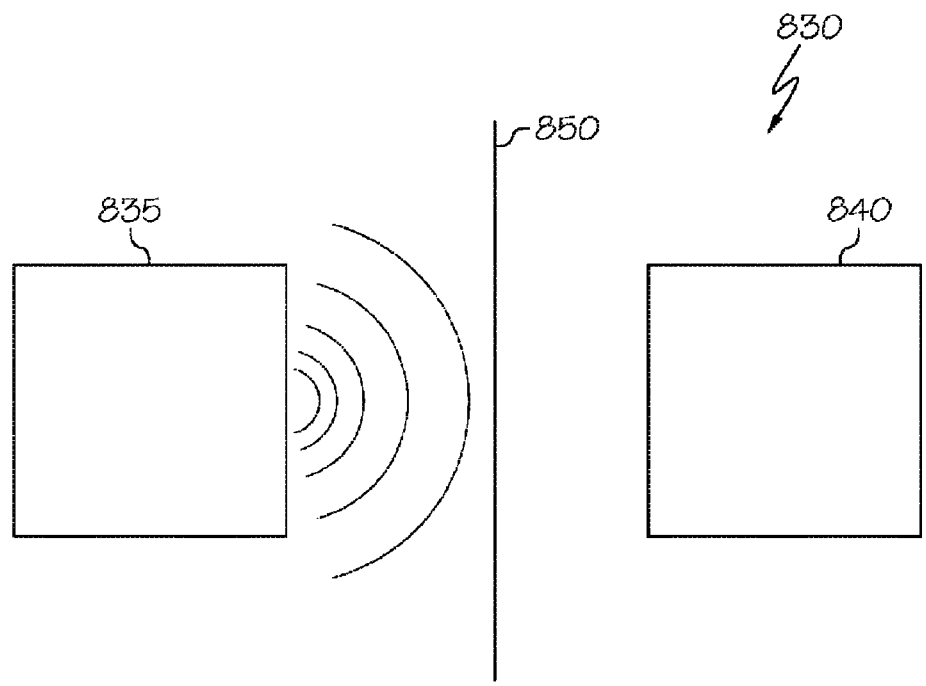
FIG. 8 is a block diagram of an optical position sensor for a reversible fan assembly according to an example embodiment.

In one embodiment, an optical switch, indicated in block diagram form in FIG. 8 at 830 includes a transmitter 835 and receiver 840 spaced apart. A tab 850 or other structure on one side of the fan assembly servers to block the path between the transmitter 835 and receiver 840 in one orientation, thus allowing the switch to provide an indication to management electronic circuitry (not shown in FIG. 8) representative of the orientation and hence the direction of the airflow 125 of the fan assembly. In one embodiment, the tab comprises the arced guide 535, but may be some other feature on one side of the fan assembly that does not interfere with proper seating of the fan assembly in the recess, nor the replacement of the limited access cover once the fan assembly is properly oriented the direction, such as the first direction 130 or second direction 410 to achieve desired direction of the airflow 125.

Figure 9:
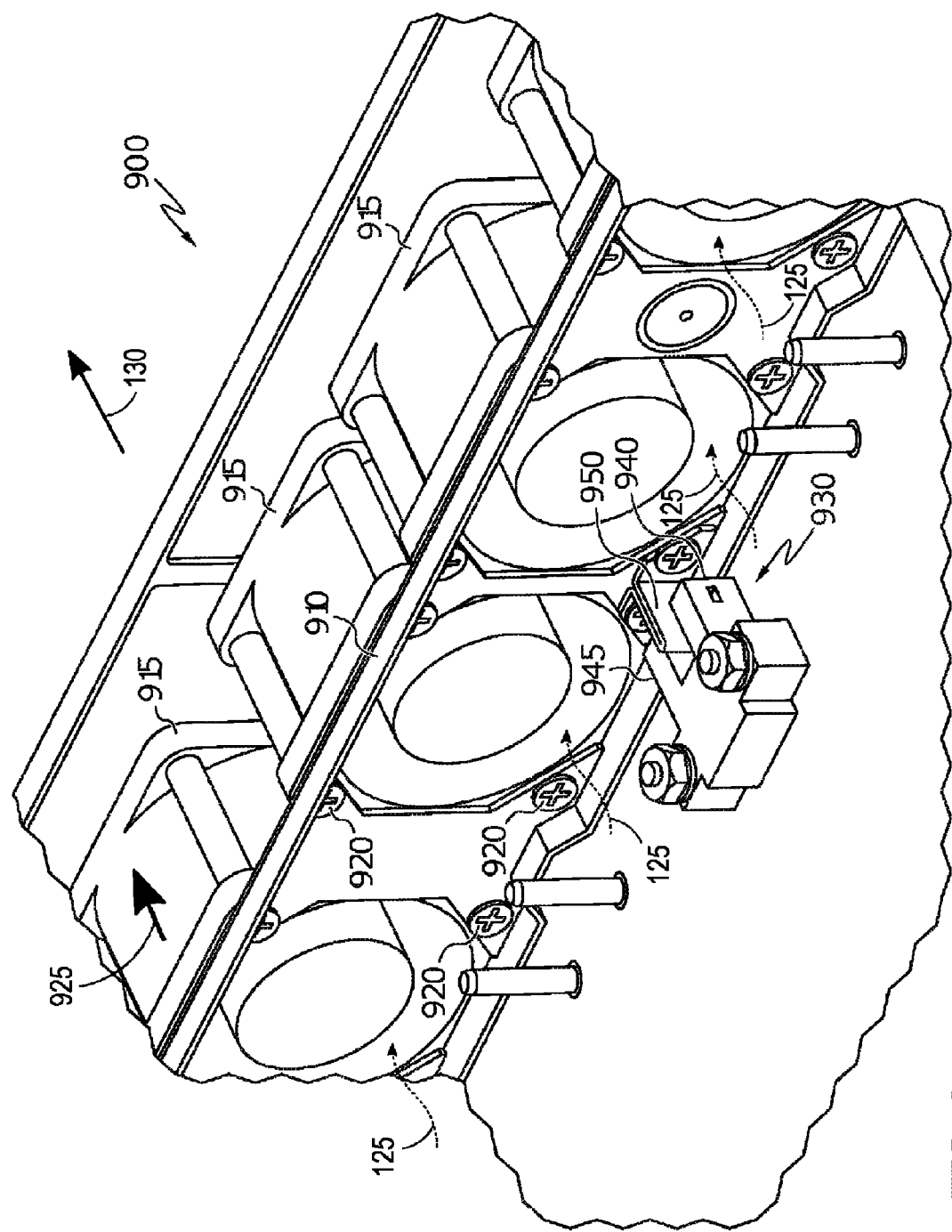
FIG. 9 is a partial block diagram of a reversible fan assembly according to an example embodiment.

FIG. 9 is a partial block diagram of a reversible fan assembly 900 disposed within a chassis 905 according to an example embodiment. The fan assembly 900 may include a frame 910 into which multiple fans 915 are attached, such as by screws 920. At least one fan 915 is shown with an arrow 925 indicating the direction of the airflow 125 for that fan, such as the first direction 130 as shown in FIG. 9. The other fans in one embodiment also provide for the airflow 125 in the same direction. A switch indicated generally at 930 is illustrated supported by a chassis 935 into which the frame 910 sits. The switch 930, as in FIG. 8 includes a light transmitter portion 940 and receiver portion 945 separated by a space into which a protrusion or tab 950 coupled to the frame 910 is positioned when the frame 910 is oriented to provide airflow 125 in a selected direction. When the frame 910 is oriented to provide airflow 125 in an opposite direction (e.g., where the first direction 130 can be opposite of the second direction 410 as shown in FIGS. 1 and 4 and described herein), the tab 950 is not positioned in the space, and does not block the light. Thus, the switch operates to indicate the orientation of the fan assembly 900 and corresponding airflow 125 direction. Switch 930 may be coupled to electronics to provide the indication of such orientation.

In one embodiment, each device may be shipped fan assembly may be shipped to customers installed in a same orientation, such as blowing air away from the device, or otherwise. The choice may depend on the most common needed orientation that customers desire. A flexible pull tab 770 may be attached to the fan assembly to allow ease of lifting of the fan assembly if the customer needs to reorient the fan assembly to blow in the opposite direction. By providing a safe and easy access method to reverse airflow 125 of the fan assembly, users may easily do so without the need to call trained service people and may do so safely, without fear of damaging the device or harming themselves.

Some or all operations of methods described herein can be performed concurrently (e.g., simultaneously), or some operations can be omitted in various example embodiments. Methods can include some operations not described herein, for example, mounting of fan assemblies in a rack, etc. The illustrations of the apparatuses (e.g., fan assemblies, etc.) described above are intended to provide a general understanding of the structure of different embodiments and are not intended to provide a complete description of all the elements and features of an apparatus that might make use of the structures described herein.

The apparatuses and methods described above may include or be included in high-speed computers, multi-core processors, message information switches, or any other computing device or electronic device. Such apparatuses may further be included as sub-components within a variety of other apparatuses.

EXAMPLES

The following examples pertain to further embodiments.

Example 1 is an electronic device comprising a chassis having a recess, and a fan assembly captured by the recess, wherein the fan assembly is moveable out of the recess to rotate such that airflow through the fan assembly moves in different directions to cool the electronic device as a function of such rotation.

In Example 2, the subject matter of Example 1 and optionally including a limited access panel supported by the chassis to provide access to the fan assembly when the limited access panel is removed.

In Example 3, the subject matter of any one of Examples 1-2 can optionally include a compressible gasket disposed between the limited access panel and the fan assembly.

In Example 4, the subject matter of any one of Examples 2-3 can optionally include the limited access panel being configured to compress the gasket between the panel and the fan assembly when the fan assembly is captured in the recess in either of two positions, the two positions corresponding to the fan assembly moving air in opposite direction.

In Example 5, the subject matter of Examples 1-4 and optionally including a sensor and a protrusion disposed on the fan assembly such that the sensor senses the protrusion when the fan assembly is captured in the recess in one of two positions corresponding the fan assembly moving air in one direction.

In Example 6, the subject matter of any one of Examples 5 can optionally include the sensor including a light projector and light receiver combination, wherein the protrusion is positionable to block light from the projector to the light receiver.

In Example 7, the subject matter of any one of Examples 3-6 can optionally include the fan assembly including a visible indication of the rotated position of the fan assembly.

In Example 8, the subject matter of Example 7 wherein the perceivable indication includes a visual indication on the fan assembly viewable through a cut-out in a limited access panel.

In Example 9, the subject matter of any one of Examples 3-8 wherein the limited access panel includes a cut-out to permit coupling an external power cord to the device, wherein removal of the limited access panel results in uncoupling the power cord to the device based on the cut-out.

In Example 10, the subject matter of any one of Examples 1-9 can optionally include a post and slot combination, wherein posts are coupled to the fan assembly and slots are formed in the recess such that the posts mate with slots and permit lifting of the fan assembly out of the recess a distance defined by a length of the slots.

In Example 11, the subject matter of any one of Examples 1-10 can optionally include a wiring harness coupled to the fan assembly and electronics supported by the chassis, the wiring harness having slack sufficient to enable rotating of the fan assembly.

Example 12 is a device having a chassis, electronic circuitry disposed within the chassis, a recess disposed within the chassis, a removable limited access panel positioned on the chassis to provide access to the recess, and a rotatable fan assembly disposed within the recess such that the fan assembly is rotatably captured by the recess and accessible by removal of the limited access panel.

In Example 13, the subject matter of Examples 12 can optionally include a compressible gasket disposed between the limited access panel and the fan assembly wherein the limited access panel compresses the gasket between the panel and the fan assembly when the fan assembly is captured in the recess in either of two positions, the two positions corresponding to the fan assembly moving air in opposite direction.

In Example 14, the subject matter of any one of Examples 12-13 can optionally include a sensor, and a protrusion disposed on the fan assembly such that the sensor senses the protrusion when the fan assembly is captured in the recess in one of two positions corresponding the fan assembly moving air in one direction.

In Example 15, the subject matter of any one of Examples 12-14 wherein the limited access panel includes a cut-out to permit coupling an external power cord to the device, wherein removal of the limited access panel results in uncoupling the power cord to the device based on the cut-out.

Example 16 is a method of changing airflow direction in an electronic device including removing a limited access panel of a rack mounted electronic device, determining a desired direction of cooling airflow based on a known orientation of the electronic device in the rack, rotating a device captured unidirectional airflow fan assembly in the electronic device that is accessible when the limited access panel has been removed to establish airflow in the desired direction, and replacing the limited access panel of the rack mounted electronic device to prevent access to the fan assembly once the fan assembly is rotated to establish airflow in the desired direction.

In Example 17, the subject matter Example 16 wherein replacing the limited access panel secures that fan assembly in its rotated position.

In Example 18 the subject matter of Example 17 wherein replacing the limited access panel presses a compressible gasket against the fan assembly.

In Example 19, the subject matter of any one of Examples 16-18 can optionally include sensing a rotated position of the fan assembly, and providing a user perceivable indication of the rotated position of the fan assembly.

In Example 20, the subject matter of Example 19 wherein sensing the rotated position of the fan assembly utilizes an optical sensor that has a light beam interrupted by the fan assembly in only one of the rotated positions of the fan assembly.

In Example 21, the subject matter of any one of Examples 19-20 wherein the perceivable indication comprises a visual indication on the fan assembly viewable through a cut-out in the limited access panel.

In Example 22, the subject matter of any one of Examples 16-21 wherein rotating the fan assembly includes lifting the assembly away from a fan assembly recess in the electronic device, rotating the assembly such that the airflow is in the desired direction, and replacing the assembly into the fan assembly recess.

In Example 23 the subject matter of Example 22 wherein the fan assembly is captured via a combination of pins and slots allowing lifting of the fan assembly a distance defined by a length of the slots.

In Example 24, the subject matter of any one of Examples 16-23 wherein the fan assembly is electrically coupled to the electronic device via a wiring harness having slack sufficient to enable rotating of the fan assembly.

In Example 25, the subject matter of any one of Examples 16-24 wherein removal of the limited access panel disconnects the fan assembly from a power supply.

Example 26 is a system having a chassis, electronic circuitry disposed within the chassis, a recess disposed within the chassis, a rotatable fan assembly disposed within the recess, and means for rotating the fan assembly such that fan assembly moves air in either of two directions depending on which direction the fan assembly is rotated.

In example 27, the subject matter of example 26 and further including a limited access panel supported by the chassis to provide access to the fan assembly when the limited access panel is removed.

In example 28, the subject matter of example 27 and further including a compressible gasket disposed between the limited access panel and the fan assembly.

In example 29, the subject matter of example 28 wherein the limited access panel compresses the gasket between the panel and the fan assembly when the fan assembly is captured in the recess in either of two positions, the two positions corresponding to the fan assembly moving air in opposite direction.

In example 30, the subject matter of example 26-29 and further including a sensor and a protrusion disposed on the fan assembly such that the sensor senses the protrusion when the fan assembly is captured in the recess in one of two positions corresponding the fan assembly moving air in one direction.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

The invention claimed is:

1. An electronic device comprising:
   a chassis configured to cover electronics, wherein the chassis includes a recess accessible through an opening in the chassis; and
   a fan assembly captured by the recess, the fan assembly includes a pin rotatably coupled between the fan assembly and the chassis, wherein an axis of the pin is translatable to move the fan assembly partially out of the recess through the opening, and the fan assembly is rotatable about the pin to change a direction of airflow between a first direction and a second direction to cool the electronic device.

2. The electronic device of claim 1, further comprising a limited access panel supported by the chassis to provide access to the fan assembly when the limited access panel is removed.

3. The electronic device of claim 2, further comprising a compressible gasket disposed between the limited access panel and the fan assembly.

4. The electronic device of claim 3, wherein the limited access panel compresses the gasket between the panel and the fan assembly when the fan assembly is captured in the recess in either of two positions, the two positions corresponding to the fan assembly moving air in the first direction and the second direction, wherein the first direction is opposite the second direction.

5. The electronic device of claim 1 and further comprising:
   a sensor; and
   a protrusion disposed on one of the chassis or the fan assembly such that the sensor senses the protrusion when the fan assembly is captured in the recess in one of two positions corresponding the fan assembly moving air in the first direction or the second direction.

6. The electronic device of claim 5, wherein the sensor comprises a light projector and light receiver combination, wherein the protrusion is positionable to block light from the projector to the light receiver.

7. The electronic device of claim 1, wherein the fan assembly includes a visible indication of the rotated position of the fan assembly.

8. The electronic device of claim 7, wherein the visual indication includes a visual indication on the fan assembly viewable through a cut-out in a limited access panel.

9. The electronic device of claim 2, wherein the limited access panel includes a cut-out to permit coupling an external power cord to the device, wherein removal of the limited access panel results in uncoupling the power cord to the device based on the cut-out.

10. The electronic device of claim 1, further comprising a slot coupled with the chassis, wherein the pin is coupled to the fan assembly and the slot is formed in the recess such that the pin mates with the slot and permits translation of the pin, and correspondingly translation of the fan assembly, out of the recess a distance defined by a length of the slot.

11. The electronic device of claim 1, further comprising a wiring harness coupled to the fan assembly and electronics supported by the chassis, the wiring harness having slack sufficient to enable rotating of the fan assembly.

12. A system comprising:
    a chassis;
    electronic circuitry disposed within the chassis;
    a recess disposed within the chassis;
    a removable limited access panel positioned on the chassis to provide access to the recess; and fan assembly disposed within the recess, the fan assembly includes a pin coupled within a slot, wherein an axis of the pin is translatable to move the fan assembly partially out of the recess, and the fan assembly is rotatable about the pin to change a direction of airflow between a first direction and a second direction to cool the electronic device, and wherein the fan assembly is accessible by removal of the limited access panel.

13. The system of claim 12, further comprising a compressible gasket disposed between the limited access panel and the fan assembly wherein the limited access panel compresses the gasket between the panel and the fan assembly when the fan assembly is captured in the recess in either of two positions, the two positions corresponding to the fan assembly moving airflow in the first direction and the second direction opposite the first direction.

14. The system of claim 12, further comprising:
a sensor; and
a protrusion disposed on one of the chassis or the fan assembly such that the sensor senses the protrusion when the fan assembly is captured in the recess in one of two positions corresponding to the fan assembly moving air in the first direction or the second direction.

15. The system of claim 12, wherein the limited access panel includes a cut-out to permit coupling an external power cord to the device, wherein removal of the limited access panel results in uncoupling the power cord to the device based on the cut-out.

\* \* \* \* \*